United States Patent
Kawabata et al.

(10) Patent No.: US 8,411,488 B2
(45) Date of Patent: Apr. 2, 2013

(54) NONVOLATILE SEMICONDUCTOR MEMORY DEVICE

(75) Inventors: Suguru Kawabata, Osaka (JP);
Shinobu Yamazaki, Osaka (JP); Kazuya Ishihara, Osaka (JP); Junya Onishi, Osaka (JP); Nobuyoshi Awaya, Osaka (JP); Yukio Tamai, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 25 days.

(21) Appl. No.: 13/233,301

(22) Filed: Sep. 15, 2011

(65) Prior Publication Data

US 2012/0081946 A1    Apr. 5, 2012

(30) Foreign Application Priority Data

Sep. 30, 2010   (JP) ................. 2010-221877

(51) Int. Cl.
*G11C 11/00*   (2006.01)
(52) U.S. Cl. ................... 365/148; 365/158
(58) Field of Classification Search .......... 365/148, 365/158, 171, 189.09, 189.011
See application file for complete search history.

(56) References Cited

U.S. PATENT DOCUMENTS

| | | | |
|---|---|---|---|
| 7,420,198 B2 * | 9/2008 | Baek et al. | 257/2 |
| 8,054,674 B2 * | 11/2011 | Tamai et al. | 365/148 |
| 2009/0273964 A1 | 11/2009 | Yamazaki et al. | |
| 2010/0172170 A1 | 7/2010 | Tamai et al. | |

FOREIGN PATENT DOCUMENTS

| | | |
|---|---|---|
| JP | 4088324 | 2/2008 |
| JP | 2008-306157 | 12/2008 |

OTHER PUBLICATIONS

Zhuang et al., "Novell Colossa Magnetoresistive Thin Film Nonvolatile Resistance Random Access Memory (RRAM)", *IEDM Technical Digest*, Dec. 2002, pp. 193-196.
Baek et al., "Highly Scalable Non-volatile Resistive Memory using Simple Binary Oxide Driven by Assymetric Unipolar Voltage Pulses", *IEDM Technical Digest*, 2004, pp. 587-590.

* cited by examiner

*Primary Examiner* — Gene Auduong
(74) *Attorney, Agent, or Firm* — Nixon & Vanderhye, P.C.

(57) ABSTRACT

A nonvolatile semiconductor memory device includes a memory cell array for storing user data provided by arranging memory cells each having a variable resistive element having a first electrode, a second electrode, and a variable resistor made of a metal oxide sandwiched between the first and second electrodes. The first and second electrodes are formed of a conductive material forming ohmic junction with the variable resistor and a conductive material forming non-ohmic junction with the variable resistor, respectively. The variable resistor changes between two or more different resistance states by applying a voltage between the electrodes. The resistance state after being changed is maintained in a nonvolatile manner. The variable resistive elements of all memory cells in the memory cell array are set to the highest of the two or more different resistance states in an unused state before the memory cell array is used to store the user data.

19 Claims, 11 Drawing Sheets

Resistance
Increasing Action

Resistance
Decreasing Action

NONVOLATILE SEMICONDUCTOR MEMORY DEVICE

CROSS REFERENCE TO RELATED APPLICATION

This Nonprovisional application claims priority under 35 U.S.C. §119(a) on Patent Application No. 2010-221877 filed in Japan on Sep. 30, 2010 the entire contents of which are hereby incorporated by reference.

BACKGROUND OF THE INVENTION

1. Field of the Invention

The present invention relates to a nonvolatile semiconductor memory device including a variable resistive element having a first electrode, a second electrode, and a variable resistor made up of a metal oxide and sandwiched between the first electrode and the second electrode, in which the metal oxide is an insulator in an initial state, its resistance is decreased by a forming process, its resistance state changes between two or more different resistance states by a voltage applied between the first electrode and the second electrode after the forming process, and the resistance state after being changed is maintained in a nonvolatile manner.

2. Description of the Related Art

In tandem with the penetration of a mobile device such as a portable electronic device, a flash memory has been widely used as a high-capacity and inexpensive nonvolatile memory which can hold stored data even in a power-off state. However, recently, since the flash memory sees limitations in miniaturization, a nonvolatile memory such as an MRAM (Magnetoresistive Random Access Memory), a PCRAM (Phase-change Random Access Memory), a CBRAM (Conductive-bridging Random Access Memory), or a RRAM (Resistance Random Access Memory) has been actively developed. Among the nonvolatile memories, the RRAM attracts attention because high-speed writing can be performed by an applied voltage, a simple binary transmission metal oxide can be used for its material so that production is easy, and affinity with an existing CMOS process is high.

It has been conventionally reported that resistance change is caused by an applied pulse voltage in the many metal oxides serving as resistance change materials which can be used in the RRAM. For example, a resistance switching element (variable resistive element) can be formed by sandwiching both ends of a metal oxide thin film formed of a ternary perovskite material such as $Pr_xCa_{1-x}MnO_3$ (PCMO), or Ni, Co, Ti, Fe, Cu, Ta, Hf, Zr, Nb, or Al between metal electrodes (refer to W. W. Zhuang, et al., "Novell Colossal Magnetoresistive Thin Film Nonvolatile Resistance Random Access Memory (RRAM)", IEDM Technical Digest, pp. 193-196, December, 2002, and Baek, I. G. et al., "Highly Scalable Non-volatile Resistive Memory using Simple Binary Oxide Driven by Asymmetric Unipolar Voltage Pulses", IEDM Technical Digest, pp. 587-590, 2004). Hereinafter, for the convenience of the description, the resistance switching element used in the RRAM is referred to as the "variable resistive element" to be discriminated from a resistance change element used in a memory other than the RRAM. Among the above materials, as for what combination of metal oxide material and metal electrode material results in optimal characteristics, some empirical knowledge has been accumulated. For example, it is known that preferable switching can be implemented by using a material having a great work function such as Pt as the electrode, for the n-type metal oxide such as an oxide of Ti and Ta, and a material having a small work function such as Ti or Ta as the electrode, for the p-type metal oxide such as an oxide of Co or Ni. Therefore, it is considered that the resistance switching action of the RRAM is preferably performed in a junction interface having a Shottky barrier between the metal oxide and the electrode (refer to Japanese Patent No. 4088324). Meanwhile, it is known that it is important to appropriately control a value of a load resistance connected to the variable resistive element in series, with respect to each action mode of the element, and to appropriately distribute the applied voltage between the variable resistive element and the load resistance.

In addition, as for a mechanism of a resistance change of the metal oxide which changes the resistance by the applied voltage, it is considered that the resistance change is caused by generation and extinction of an oxygen defect or movement thereof by an electric field in the oxide in the cases of the perovskite material, Ti oxide, or Ni oxide.

Meanwhile, various tests (such as a function test or a quality test) are performed on the nonvolatile semiconductor memory device such as the RRAM before shipment, and only a chip or a block (a part of the memory cell array) which has passed the test is shipped as a product. At this time, information specific to the individual product (such as relieving information in a case where a memory cell in a part of the memory cell array is used for the redundancy relieving, information such as a defect block address in a case where a part of a defect block is not used, or product information (such as production number) and the like) is programmed in a nonvolatile memory element provided for storing the specific information, to perform redundancy relieving for the defect memory cell, inactivate the defect block, and keep the product information. Meanwhile, as for the memory cell array for storing the user data, all of the memory cells are uniformly set in the same storage state and specific information is not stored at the time of normal shipment.

The nonvolatile semiconductor memory device to be shipped as the product is generally housed in a package by resin sealing and the like, and on the user side, soldered on a predetermined substrate and incorporated in a final product. At this time, in a case where the product specific information stored in the nonvolatile memory element for storing the specific information is unexpectedly written due to a high-temperature treatment such as a solder reflow treatment (such as high-temperature treatment performed at about 260° C.) on the user side, there is a possibility that the redundancy relieving and the inactivation of the defect block cannot function normally, which causes an action defect. In addition, when the product information is written, correct history information at a production stage cannot be known when defect on the market occurs, so that it is difficult to analyze the defect. Furthermore, when the data of the memory cell array for storing the user data is partially written, the user could have a suspicion that the product is a used product in which some data is programmed, or a defective product.

Thus, the present inventor has examined whether or not there is a possibility that the resistance state (stored information) of the variable resistive element is written due to the high temperature treatment after shipment on the user side, using a variable resistive element including a first electrode, a second electrode, and a variable resistor made up of a metal oxide and sandwiched between the first electrode and the second electrode, in which the metal oxide is an insulator in an initial state, its resistance is decreased by a forming process, its resistance state changes between two or more different resistance states by a voltage applied between the first electrode and the second electrode after the forming process, and the resistance state after being changed is maintained in a nonvolatile manner. Thus, it has been confirmed that when a resistance decreasing action to change the resistance state of the variable resistive element from the high resistance state to the low resistance state is performed under a normal program condition (standard program condition set to satisfy product specification), the resistance of the variable resistive element is increased by more than 2 times within a several hours after the variable resistive element programmed into the low resistance state has been left an unbiased state under a high temperature of 150° C. or more, and it has been confirmed that the higher the temperature is, the faster the resistance increase is.

Furthermore, an earnest study by the inventor of the present application has found that the resistance change from the low resistance state to the high resistance state after being left at the above high temperature can be considerably prevented to an allowable degree in practical use by further decreasing the resistance of the variable resistive element under a program condition to make the resistance state lower, as compared with the normal program condition. Furthermore, as for the variable resistive element which has been programed into the high resistance state under the normal program condition, even when it is left at the high temperature similarly to the above, the large resistance change which is problematic in practical use is not confirmed although the resistance is a little increased (such as several %).

SUMMARY OF THE INVENTION

The present invention was made in view of the fact that as for the variable resistive element which changes the resistance state between two or more different resistance states by an applied voltage, and maintains the resistance state after being changed in a nonvolatile manner, the resistance change from the low resistance state to the high resistance state could be generated under a high temperature required for a solder reflow treatment after shipment, and it is an object of the present invention to provide a nonvolatile semiconductor memory device superior in data retention characteristics under high temperatures around 260° C.

In order to attain the object, according to the present invention, in a nonvolatile semiconductor memory device including a memory cell array for storing user data, provided by arranging a plurality of the memory cells each provided with a variable resistive element having a first electrode, a second electrode, and a variable resistor made up of a metal oxide and sandwiched between the first electrode and the second electrode, the metal oxide being an insulator in an initial state, resistance of the variable resistive element being decreased by a forming process, a resistance state of the variable resistive element changing between two or more different resistance states by application of a voltage between the first electrode and the second electrode after the forming process, the resistance state after being changed being maintained in a nonvolatile manner, the nonvolatile semiconductor memory device is provided having first characteristics that the variable resistive elements of all of the memory cells in the memory cell array are set to the highest resistance state of the two or more different resistance states in an unused state before the memory cell array is used to store the user data, and a programming method in the nonvolatile semiconductor memory device is provided having first characteristics that the variable resistive elements of all of the memory cells in the memory cell array are made to the highest resistance state of the two or more different resistance states in an unused state before the memory cell array is used to store the user data.

In addition, in order to attain the above object, according to the present invention, in a nonvolatile semiconductor memory device including the memory cell array for storing the user data, a specific memory region for storing specific data other than the user data using one or more variable resistive elements, and a program circuit to execute a resistance increasing action to change the resistance state of the variable resistive element from a low resistance state to a high resistance state, and a resistance decreasing action to change the resistance state thereof from the high resistance state to the low resistance state, by applying a program voltage between the first electrode and the second electrode to pass a program current through the variable resistive element in the memory cell array, the nonvolatile semiconductor memory device is provided having second characteristics that in an unused state before the memory cell array is used to store the user data, the resistance of at least one part of the variable resistive elements of the specific memory region is decreased by the resistance decreasing action under an enhanced application condition that at least one of a voltage applying time and a current value of the program current is increased, as compared with a condition of the program voltage applied when the program circuit executes the resistance decreasing action for the variable resistive element in the memory cell array, and a programming method in the nonvolatile semiconductor memory device is provided having second characteristics that in an unused state before the memory cell array is used to store the user data, the resistance of at least one part of the variable resistive elements of the specific memory region is decreased by the resistance decreasing action under an enhanced application condition that at least one of a voltage applying time and a current value of the program current is increased, as compared with a condition of the program voltage applied when the program circuit executes the resistance decreasing action for the variable resistive element in the memory cell array.

In addition, in order to attain the above object, according to the present invention, in a nonvolatile semiconductor memory device including the memory cell array for storing the user data, a specific memory region for storing specific data other than the user data using one or more variable resistive elements, and a program circuit to execute a resistance increasing action to change the resistance state of the variable resistive element from a low resistance state to a high resistance state, and a resistance decreasing action to change the resistance state thereof from the high resistance state to the low resistance state, by applying a program voltage between the first electrode and the second electrode to pass a program current through the variable resistive element in the memory cell array, a nonvolatile semiconductor memory device is provided having third characteristics that the program circuit executes the resistance decreasing action when the program circuit programs the user data in the variable resistive element in the memory cell array, under a condition that at least one of a voltage applying time and a current value of the program current is decreased, as compared with a condition of the program voltage applied when the resistance decreasing action is performed for at least one part of the variable resistive elements of the specific memory region in the unused state, and a programming method in a nonvolatile semiconductor memory device is characterized as third characteristics in that the program circuit executes the resistance decreasing action when the program circuit programs the user data in the variable resistive element in the memory cell array, under a condition that at least one of a voltage applying time and a current value of the program current is decreased, as compared with a condition of the program voltage applied when the resistance decreasing action is performed for at least one part of the variable resistive elements of the specific memory region in the unused state.

In addition, in the description of the present specification, the user means a user of the nonvolatile semiconductor memory device after shipment, and the user data means data to be stored in the nonvolatile semiconductor memory device by the user.

In addition, the present invention provides the nonvolatile semiconductor memory device and the programming method in the nonvolatile semiconductor memory device having at least two characteristics among the first characteristics, the second characteristics, and the third characteristics. In addition, the second characteristics and the third characteristics have the same relative relationship of the program conditions in the resistance decreasing action for the specific memory region and the memory cell array although the focused point of view of the resistance decreasing action is different.

Furthermore, according to the nonvolatile semiconductor memory device or the programming method in the nonvolatile semiconductor memory device having the first, second, or third characteristics, it is preferable that the variable resistor is formed of a metal oxide showing an n-type conductivity, a work function of the second electrode is larger than a work function of the first electrode, or the variable resistor contains a metal oxide selected from Ti, Ta, Hf, and Zr.

Based on the fact obtained by the inventor that as for the variable resistive element which changes the resistance state between the two or more different resistance states by the applied voltage and maintains the resistance state after being changed in a nonvolatile manner, the resistance change under the high temperature required for the solder reflow treatment after shipment is generated only from the low resistance state to the high resistance state, and the resistance change is considerably prevented so as not to be problematic in practical use by performing the resistance decreasing action under the enhanced program condition so that the resistance state becomes a further lowered state, as compared with the normal program condition, the nonvolatile semiconductor memory device or the programming method in the nonvolatile semiconductor memory device having the above characteristics can solve the problem generated when the product after shipment is left at the high temperature required for the solder reflow process.

More specifically, the nonvolatile semiconductor memory device or the programming method in the nonvolatile semiconductor memory device having the first characteristics can solve the problem that the data stored in the memory cell array for storing the user data is unexpectedly written, and the nonvolatile semiconductor memory device or the programming method in the nonvolatile semiconductor memory device having the second or third characteristics can prevent the information specific to the individual product such as the redundancy relieving information or the production number from being unexpectedly written due to the resistance change of the variable resistive element, so that the action defect and the like caused by the above can be prevented from being induced.

DESCRIPTION OF THE PREFERRED EMBODIMENT

A description will be made of a nonvolatile semiconductor memory device (hereinafter, referred to as the "device of the present invention") according to the present invention, and a programming method (hereinafter, referred to as the "method of the present invention") in the same, with reference to the drawings.

Figure 1:
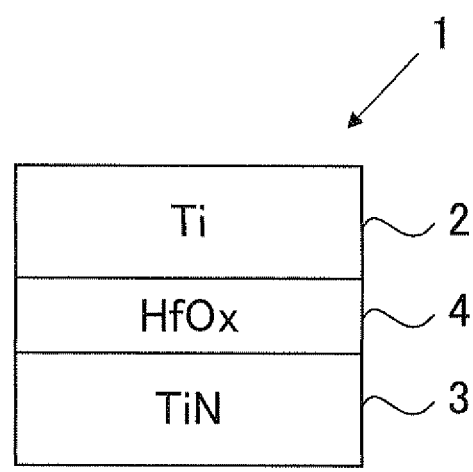
FIG. 1 is a cross-sectional view schematically showing a basic structure of a variable resistive element used in a nonvolatile semiconductor memory device according to the present invention.

First, a description will be made of a variable resistive element used in the device of the present invention. FIG. 1 is a view schematically showing a basic structure of a variable resistive element 1. The variable resistive element 1 has a three-layer structure including a first electrode 2, a second electrode 3, and a variable resistor 4 sandwiched between the both electrodes in a simplest planar type structure. In addition, the structure of the variable resistive element is not limited to the planar type structure, and it may include, for example, a flat-plate electrode having an opening, a columnar electrode positioned in the center of the opening, and an annular variable resistor sandwiched between the flat-plate electrode and the columnar electrode, that is, the structure only has to have a two-terminal structure in which the variable resistor 4 is sandwiched between the two electrodes 2 and 3.

Furthermore, according to this embodiment, the two electrodes having different work functions (assuming that the first electrode has a smaller work function, and the second electrode has a larger work function, for descriptive purposes) are used, and the first electrode 2 is the upper electrode and the second electrode 3 is the lower electrode, for example, in the planar type structure shown in FIG. 1. In addition, the variable resistor 4 is made of a metal oxide showing an n-type conductivity. The n-type metal oxide used for the variable resistor 4 includes a metal oxide such as Ti, Ta, Hf or Zr. In this embodiment $HfO_x$ (such as $HfO_2$) is used as the variable resistor 4.

In addition, when the n-type metal oxide is used as the variable resistor 4, the first electrode needs to be formed of a conductive material having the small work function so that an interface with the variable resistor 4 becomes an ohmic junction, and the second electrode needs to be formed of a conductive material having the large work function so that an interface with the variable resistor 4 becomes a non-ohmic junction (Schottky junction). A specific value of the work function depends on a relationship with an electron trapping level generated due to an oxygen defect in the oxide of the variable resistor 4, and in the case of the n-type metal oxide, the work function of the second electrode is preferably 4.5 eV or more, and the work function of the first electrode is preferably 4.2 eV or less. The electrode material which can be used in a semiconductor process among metals satisfying the above condition includes Ti (4.2 eV), Hf (3.9 eV), Al (4.1 eV), and Ta (4.2 eV) for the first electrode, for example, and W (4.5 eV), Ni (5 eV), TiN (4.7 eV), WN (5 eV), NiSi (4.9 eV), and $TaC_xN_y$ (4.4 to 4.8 eV) for the second electrode. The number in parentheses shown after each of the materials is the work function. According to this embodiment, a description will be made of an embodiment in which Ta is used for the first electrode, and the TiN is used for the second electrode in the case where the variable resistor 4 is formed of $HfO_x$.

A mechanism of a resistance change (switching action) of the variable resistive element having the above structure is considered as follows. That is, a resistance state of the variable resistor between the electrodes 2 and 3 just after the variable resistor 4, and the electrodes 2 and 3 have been formed is in a high resistance state higher than a resistance change range of the switching action, and even when a voltage is applied between the electrodes 2 and 3 under a normal program condition, the switching action is not generated. Thus, a forming process to initialize (to decrease resistance) the variable resistive element to a resistance state in which the switching action can be performed, and a current path (filament path) is formed in the variable resistor so that a current (program current) flows at the time of the switching action. Once the filament path is formed, the resistance state changes due to the generation and extinction of the oxygen defect in the filament path when the voltage is applied to the electrodes 2 and 3.

Note that, in the following description, a programming action to move the resistance state of the variable resistive element from the low resistance state to the high resistance state by applying a voltage between the electrodes 2 and 3 is referred to as a resistance increasing action, while a programming action to move the resistance state thereof from the high resistance state to the low resistance state is referred to as a resistance decreasing action, and the two programming actions (resistance increasing action and the resistance decreasing action) are collectively referred to as the programming action.

Figure 2A:
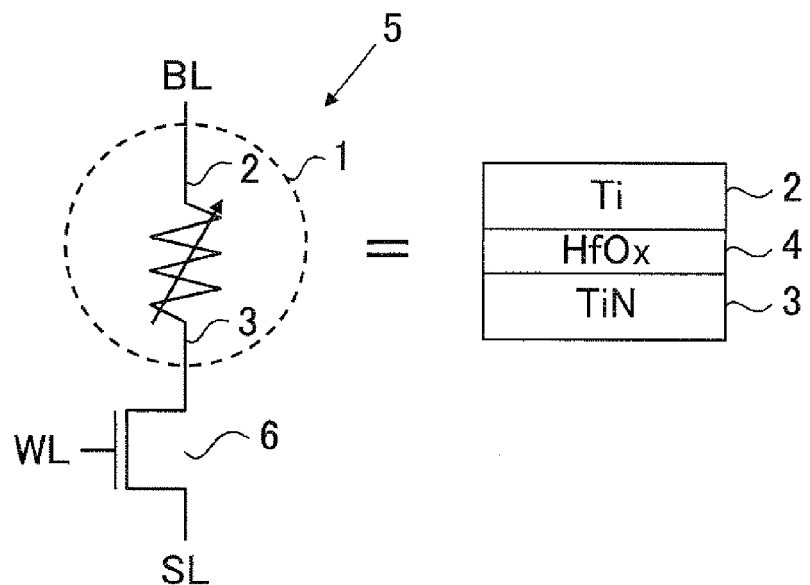
FIGS. 2A to 2C are circuit diagrams showing one example of a configuration of a memory cell used in the nonvolatile semiconductor memory device according to the present invention.
Figure 2B:
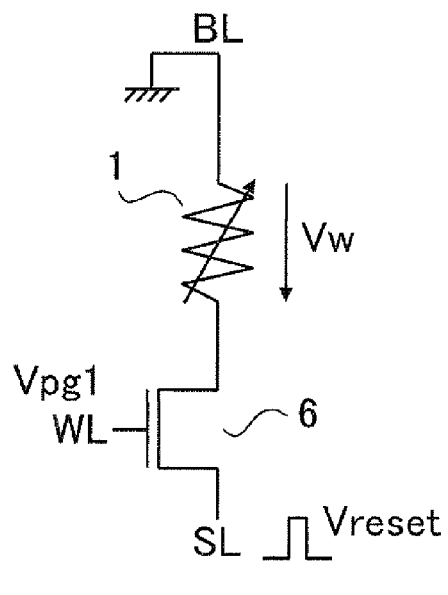
Figure 2C:
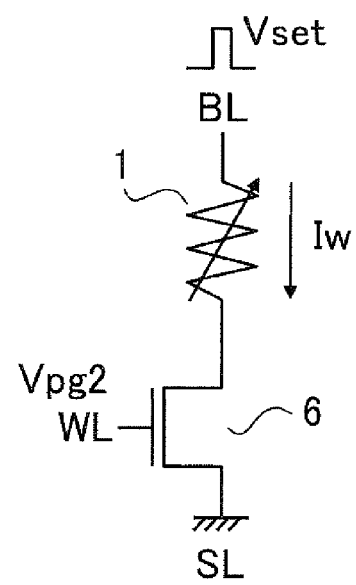
Figure 3:
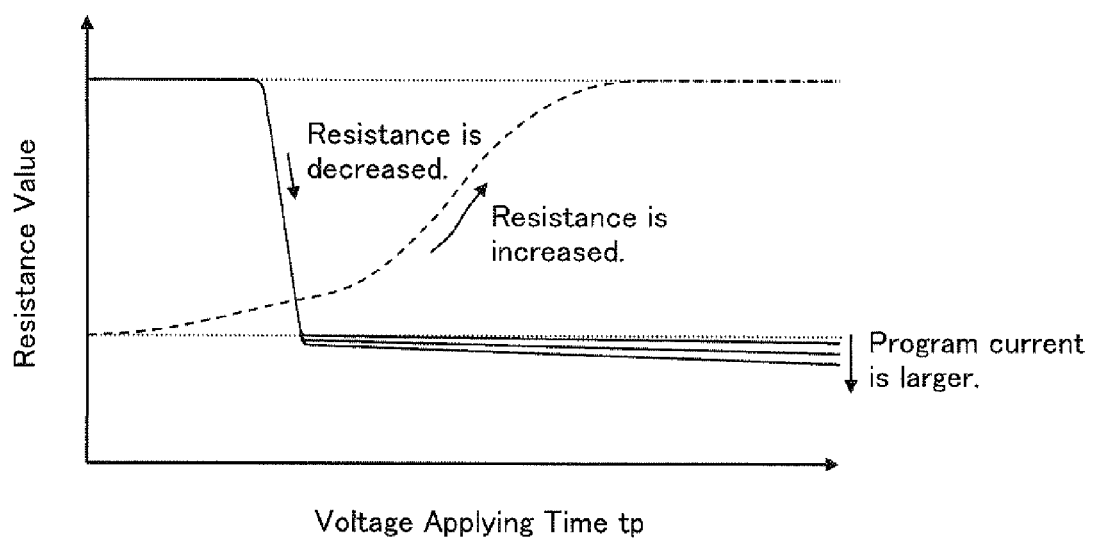
FIG. 3 is a view schematically showing a resistance change with respect to a voltage applying time in a resistance increasing action and a resistance decreasing action for the variable resistive element used in the nonvolatile semiconductor memory device according to the present invention.

Next, a description will be made of data retention characteristics under a high temperature in the device of the present invention. First, a description will be made of a structure of a memory cell serving as a measurement target of the data retention characteristics under the high temperature, and a voltage applying condition to the memory cell to be measured. A memory cell 5 used for the measurement includes a series circuit having the variable resistive element 1 shown in FIG. 1, and a selection transistor 6, as schematically shown in FIG. 2A. More specifically, the selection transistor 6 is an enhancement type N-channel MOSFET in which a conductivity type of a source and a drain is N type, and a threshold voltage is a positive voltage (about +0.1 V to +1.5 V, for example). Thus, the second electrode 3 of the variable resistive element 1 is connected to the drain of the selection transistor 6, the first electrode 2 of the variable resistive element 1 is connected to a bit line BL, the source of the selection transistor 6 is connected to a source line SL, and a gate of the selection transistor 6 is connected to a word line WL. According to the resistance increasing action of the variable resistive element 1 serving as the measurement target, the bit line BL is grounded, a predetermined gate voltage Vpg1 is applied to the word line WL to turn on the selection transistor 6, a positive voltage pulse Vreset is applied to the source line SL, and a voltage pulse of a program voltage Vw of a threshold voltage or more required for the resistance increasing action is applied to the variable resistive element 1 (refer to FIG. 2B). According to the resistance decreasing action of the variable resistive element serving as the measurement target, the source line SL is grounded, a predetermined gate voltage Vpg2 is applied to the word line WL to turn on the selection transistor 6, a positive voltage pulse Vset is applied to the bit line BL, and a voltage pulse of a threshold voltage or more required for the resistance decreasing action is applied to the variable resistive element 1 to keep a constant program current Iw flowing in the variable resistive element 1 (refer to FIG. 2C). The gate voltages Vpg1 and Vpg2 applied to the word line WL are adjusted so that the required program current Iw flows in the variable resistive element 1. As schematically shown in FIG. 3, in the resistance decreasing action, the resistance state of the variable resistive element 1 is instantaneously decreased after the voltage application in nano-second order and a resistance value after resistance has been decreased depends on a value of the program current Iw and a voltage applying time tp such that the larger the program current Iw is, the lower the resistance value is, and the resistance is further decreased by allowing the program current to continuously flow after the resistance is decreased once. Meanwhile, in the resistance increasing action, the resistance state of the variable resistive element 1 is gradually increased with the voltage applying time. It is supposed that this is because the oxygen defect in the filament path is gradually extinguished due to Joule heat generated while the program current Iw continuously flows. FIGS. 4 to 7 show results obtained by measuring the resistance value varying with the elapsed time (exposure time) when being left in an unbiased state under a high temperature.

Figure 4:
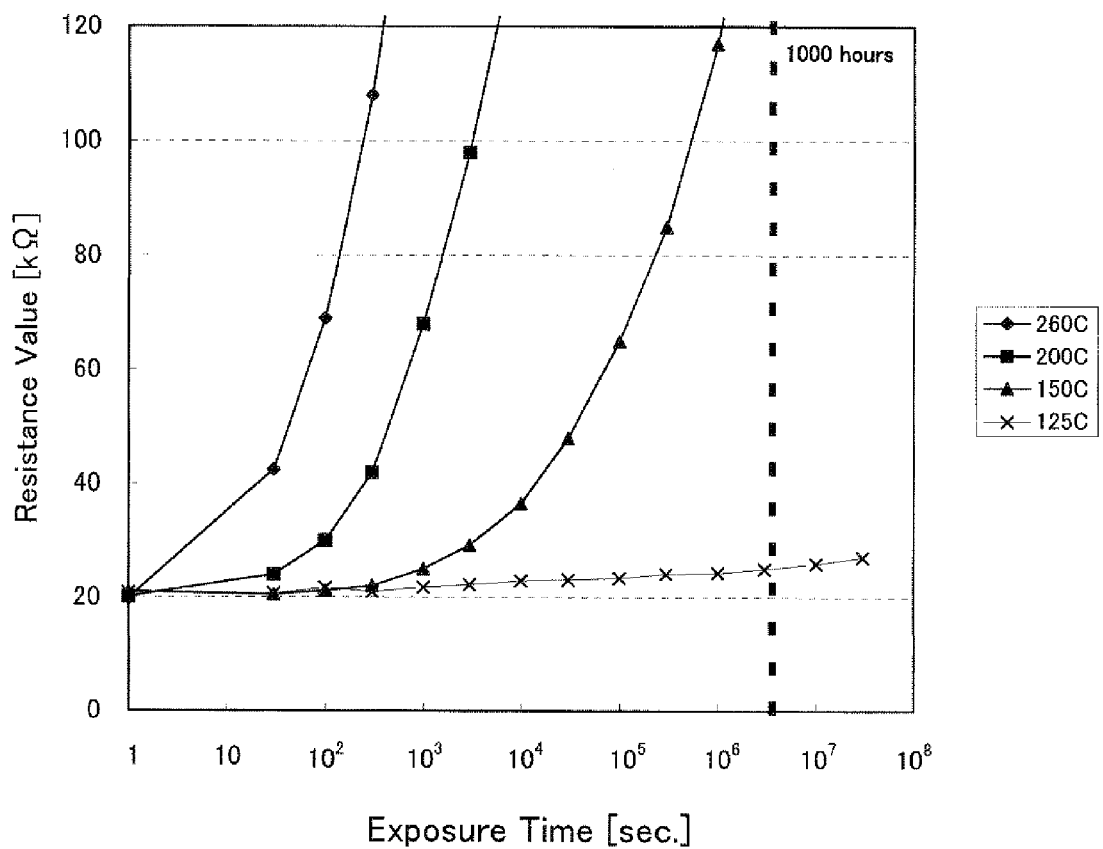
FIG. 4 is a view showing a measurement result of a shift of an elapsed time and a resistance value after the variable resistive element in the low resistance state is left in an unbiased state at a high temperature.

FIG. 4 shows a measurement result when the memory cells serving as the measurement targets which have been subjected to the resistance decreasing action under a normal program condition (program current Iw=100 µA and pulse width tp=50 ns) are left, respectively, at 260° C., 200° C., 150° C., and 125° C.

As shown in FIG. 4, while the resistance is only increased by 1.5 times at 125° C. even after being left for 1000 hours, the resistance is increased by 2 times or more after ten and several seconds, increased by about 3 to 4 times after 100 seconds, and increased by 5 times or more after 200 seconds at 260° C. When the temperature is 200° C., the resistance increase after 100 seconds is reduced to the increase by about 1.5 times. Since a solder reflow treatment is performed at 260° C. for 100 seconds in general, the resistance value of the variable resistive element is increased by 3 to 4 times under the temperature. For example, when the variable resistive element is used to store redundancy relieving information, there is a possibility that the redundancy relieving information cannot be correctly read and the redundancy relieving cannot normally function because the variable resistive element in the low resistance state is increased in resistance. In addition, when it is assumed that the memory cell is left at 260° C. for about 200 seconds, there is a possibility that the variable resistive element in the low resistance state is determined as being in the high resistance state, in the reading action of the memory cell array for storing the user data. That is, the measurement result in FIG. 4 suggests that the data retention characteristics deteriorate under the above-mentioned high temperatures. However, what defect phenomenon specifically appears due to the deterioration in data retention characteristics largely depends on a circuit configuration of a readout circuit and the like, and structures of the variable resistive element, the memory cell, and the memory cell array.

Figure 5:
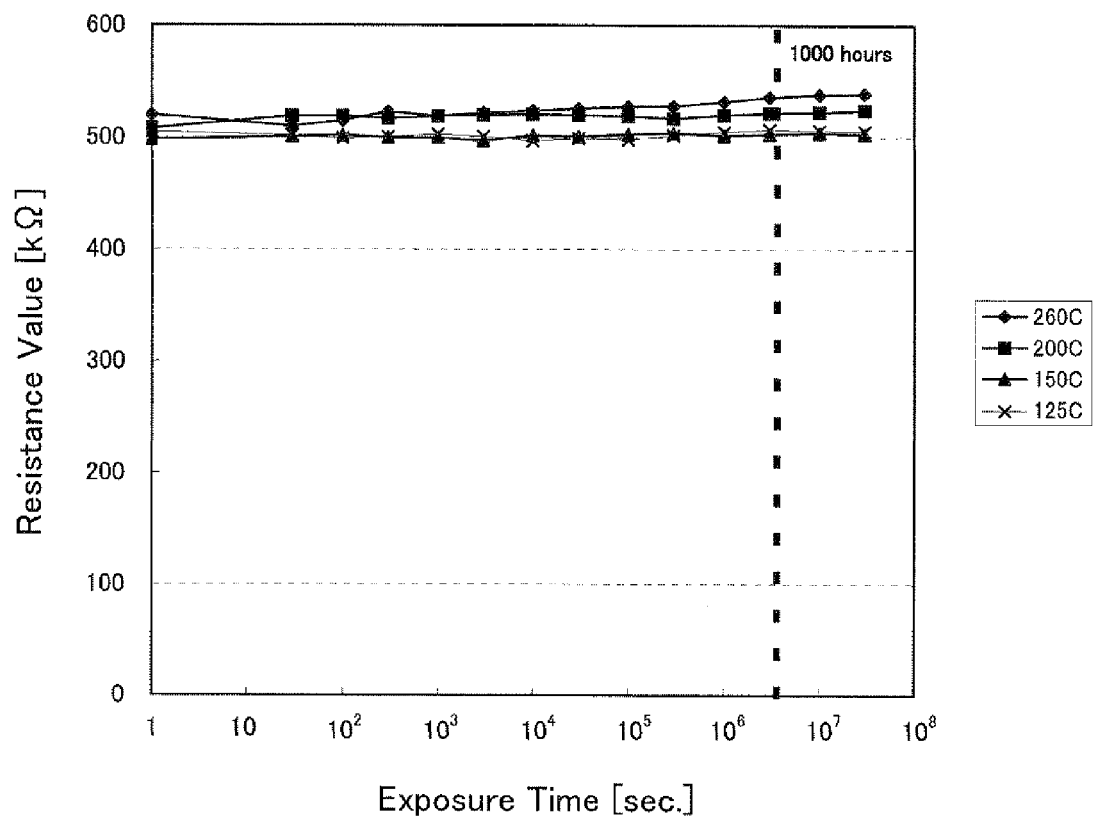
FIG. 5 is a view showing a measurement result of a shift of an elapsed time and a resistance value after the variable resistive element in the high resistance state is left in an unbiased state at a high temperature.

FIG. 5 shows a measurement result when the memory cells serving as the measurement targets which have been subjected to the resistance increasing action under the normal program condition (program voltage Vw=1.5 V and pulse width tp=50 ns) are left at 260° C., 200° C., 150° C., and 125° C., respectively.

As shown in FIG. 5, the resistance is hardly changed at 125° C. and 150° C. after being left for 1000 hours, and the resistance is merely increased a little (about several %) at 200° C. and 260° C. after being left for 1000 hours. Therefore, when the resistance state of the variable resistive element is in the high resistance state, the resistance state is not substantially changed at the high temperature of 260° C. after being left for a long time.

Figure 6:
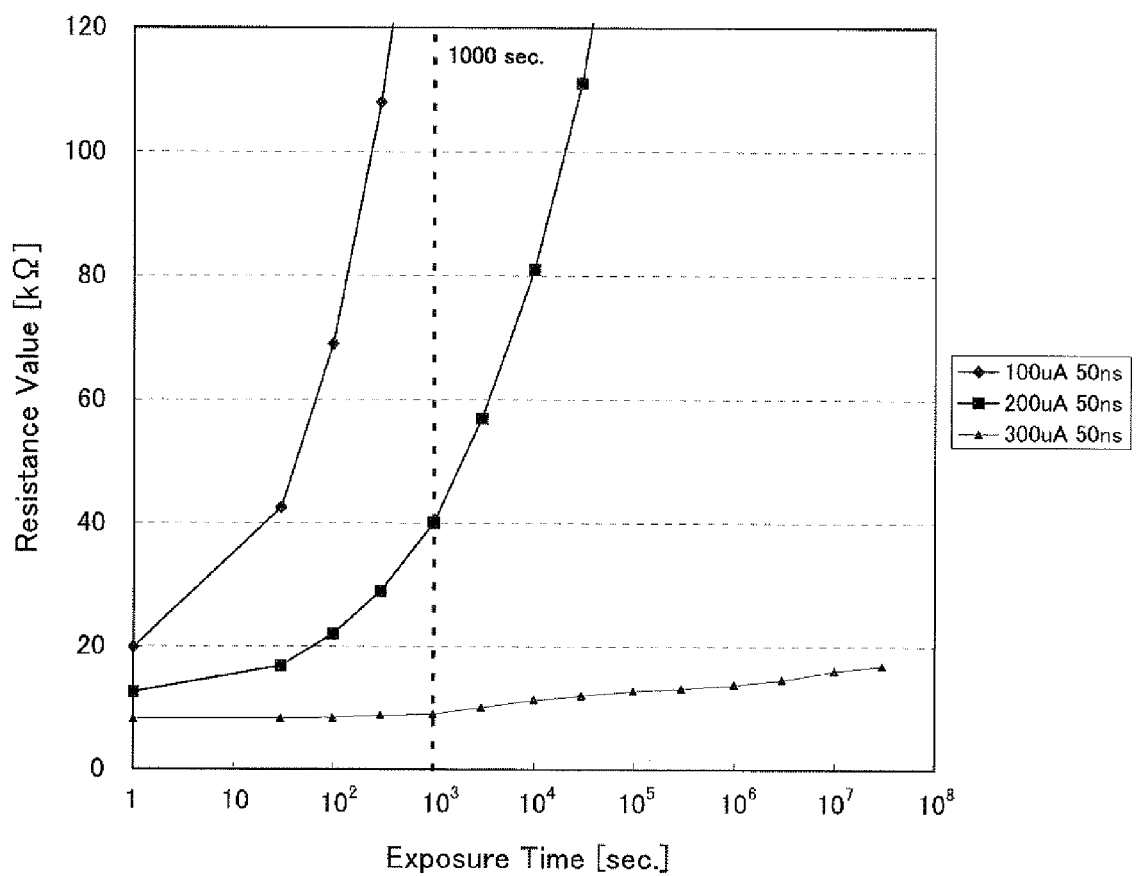
FIG. 6 is a view showing a result of measurement of a shift of an elapsed time and a resistance value after the variable resistive element in the low resistance state is left in an unbiased state at a high temperature under the condition that a program current value at the time of the resistance decreasing action is changed.

FIG. 6 shows a measurement result when the memory cells serving as the measurement targets which have been subjected to the resistance decreasing action under three program conditions in which the program current Iw is varied (program current Iw=100 µA, 200 µA, and 300 µA and pulse width tp=50 ns) are left at 260° C. The measurement result of the memory cell which has been subjected to the resistance decreasing action under the normal program condition (program current Iw=100 µA, and pulse with tp=50 ns) is as shown in FIG. 4.

As shown in FIG. 6, in the case where the program current Iw is larger than the normal program condition, while it takes about 20 seconds for the resistance value to be increased by 2 times when the program current Iw=100 µA, it takes about 1000 seconds for the resistance value to be increased to the same value as the above when the program current Iw=200 µA to be increased by two times. Since the general solder reflow treatment is performed at 260° C. for 100 seconds, the resistance after being left for 100 seconds stays within the same value as the resistance value provided when decreased under the normal program condition. In addition, when the program current Iw is further increased to 300 µA, the resistance value after being left for 1000 hours or more is the same or less than the resistance value provided when decreased under the normal program condition. Based on this measurement result, it is found that the increase in resistance due to being left at the high temperature of 260° C. can be prevented by setting the program current Iw at the value higher than the normal set value in the resistance decreasing action. More specifically, by setting the program current Iw to be 2 times as large as the normal set value, as long as the elapsed time is within 1000 seconds, even after being left at 260° C., the resistance value is not increased more than 2 times the resistance value provided when decreased under the normal program condition. Therefore, as long as the resistance increase by 2 times or less can be allowed in the circuit configuration of the readout circuit and the like, the effect due to being left for 1000 hours is allowed by setting the program current Iw to 2 times as large as the normal set value. Therefore, according to the present embodiment, it is supposed that the deterioration in data retention characteristics caused by being left for a long time at the high temperature can be sufficiently prevented by setting the program current Iw to 2 times, preferably 3 times as large as the normal set value.

Figure 7:
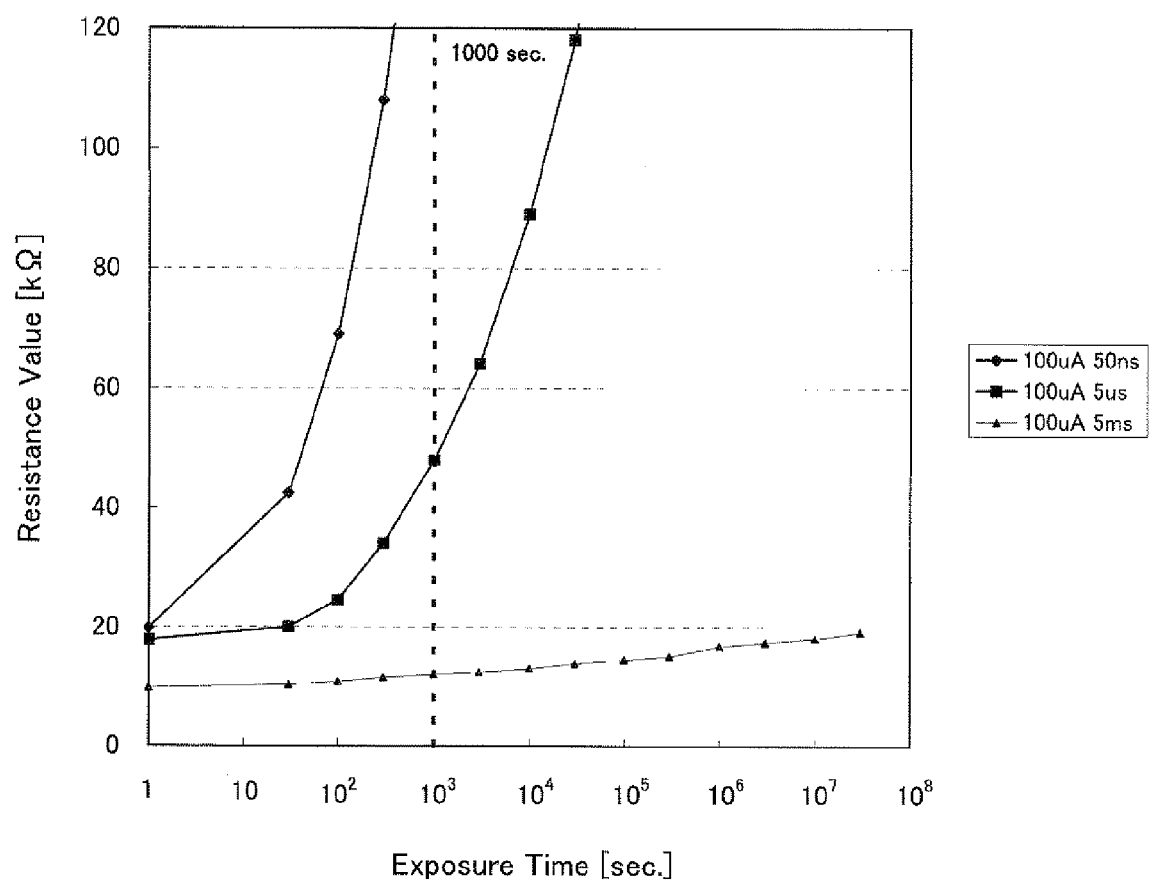
FIG. 7 is a view showing a result of measurement of a shift of an elapsed time and a resistance value after the variable resistive element in the low resistance state is left in an unbiased state at a high temperature under the condition that a pulse width at the time of the resistance decreasing action is changed.

FIG. 7 shows a measurement result when the memory cells serving as the measurement targets which have been subjected to the resistance decreasing action under three program conditions in which the pulse width is varied (program current Iw=100 µA, and pulse width tp=50 ns, 5 µs, and 5 ms) are left at 260° C. The measurement result of the memory cell which has been subjected to the resistance decreasing action under the normal program condition (program current Iw=100 µA, and pulse with tp=50 ns) is as shown in FIG. 4.

As shown in FIG. 7, in the case where the pulse width tp is larger than the normal program condition, while it takes about 20 seconds for the resistance value to be increased by 2 times when the pulse width tp=50 ns, it takes about 600 seconds for the resistance value to be increased to the same value as the above when the pulse width tp=5 µs. Since the general solder reflow treatment is performed at 260° C. for 100 seconds, the resistance increase after being left for 100 seconds stays within the same value as the resistance value provided when decreased under the normal program condition. In addition, when the pulse width tp is further increased to 5 ms, the resistance value after being left for 1000 hours or more is the same or less than the resistance value reduced under the normal program condition. Based on this measurement result, it is found that the increase in resistance due to being left at the high temperature of 260° C. can be prevented by setting the pulse width tp to the value longer than the normal set value under the resistance decreasing action. More specifically, by setting the pulse width tp to be 100 times as long as the normal set value, as long as the elapsed time is within 600 seconds, even after being left at 260° C., the resistance value is not increased more than 2 times the resistance value provided when decreased under the normal program condition. Therefore, as long as the resistance increase by 2 times or less can be allowed in the circuit configuration of the readout circuit and the like, the effect due to being left for 600 seconds is allowed by setting the pulse width tp to 100 times as long as the normal set value. Therefore, according to the present embodiment, it is supposed that the deterioration in data retention characteristics caused by being left for a long time at the high temperature can be sufficiently prevented by setting the pulse width tp to 100 times or more, preferably 1000 times or more, further preferably 100000 times as long as the normal set value.

In addition, according to the measurement results in FIGS. 6 and 7, both of the program current Iw and pulse width tp may be increased compared to the normal program condition, and in this case, the effect is the same as that obtained by further increasing one of them.

In addition, as for the n-type metal oxide containing the HfO$_x$, as described above, it is considered that the oxygen defect in the filament path in the metal oxide formed by the forming treatment is generated, extinguished, or moved by the electric field, whereby the resistance switching is generated, and the oxygen defect is extinguished by the Joule heat due to the program current. Therefore, the measurement results shown in FIGS. 4 to 7 are applied to the n-type metal oxide other than HfO$_x$, used for the variable resistor 4. In addition, as will be described below, the results are also applied to a p-type metal oxide.

Based on the new knowledge obtained from the measurement results in FIGS. 4 to 7, according to the device of the present invention, first, in the memory region using the variable resistive elements 1 each having the structure shown in FIG. 1, with respect to the memory cell array for user data storage provided by arranging the memory cells each having the variable resistive element 1, the resistance state of the variable resistive elements of all of the memory cells in the memory cell array is increased to the highest resistance state in an unused state before data is programmed in the memory cell array by the user. In addition, secondly, in the unused state, with respect to the specific memory region provided for storing data specific to individual product (hereinafter, referred to as the specific data) using the same variable resistive elements, other than the user data, when the resistance of the variable resistive element needs to be programmed to the low resistance state partially or wholly in the specific memory region, based on the contents of the specific data, the resistance decreasing action is performed with at least one of the program current and the applying time of the voltage pulse increased, compared to the program condition of the resistance decreasing action for the variable resistive element of the memory cell array for storing the user data.

According to this embodiment, the unused state assumes a state before shipment of the device of the present invention. In addition, the specific data assumes redundancy relieving data when redundancy relieving is performed for the memory cell array, or a product reference data such as the product number, but any data other than the user data can be stored in the specific memory region. According to this embodiment, a description will be made of a case where a defect block address for block redundancy relieving as will be described below is stored in the specific memory region as the specific data, and the block redundancy relieving is performed.

Figure 8:
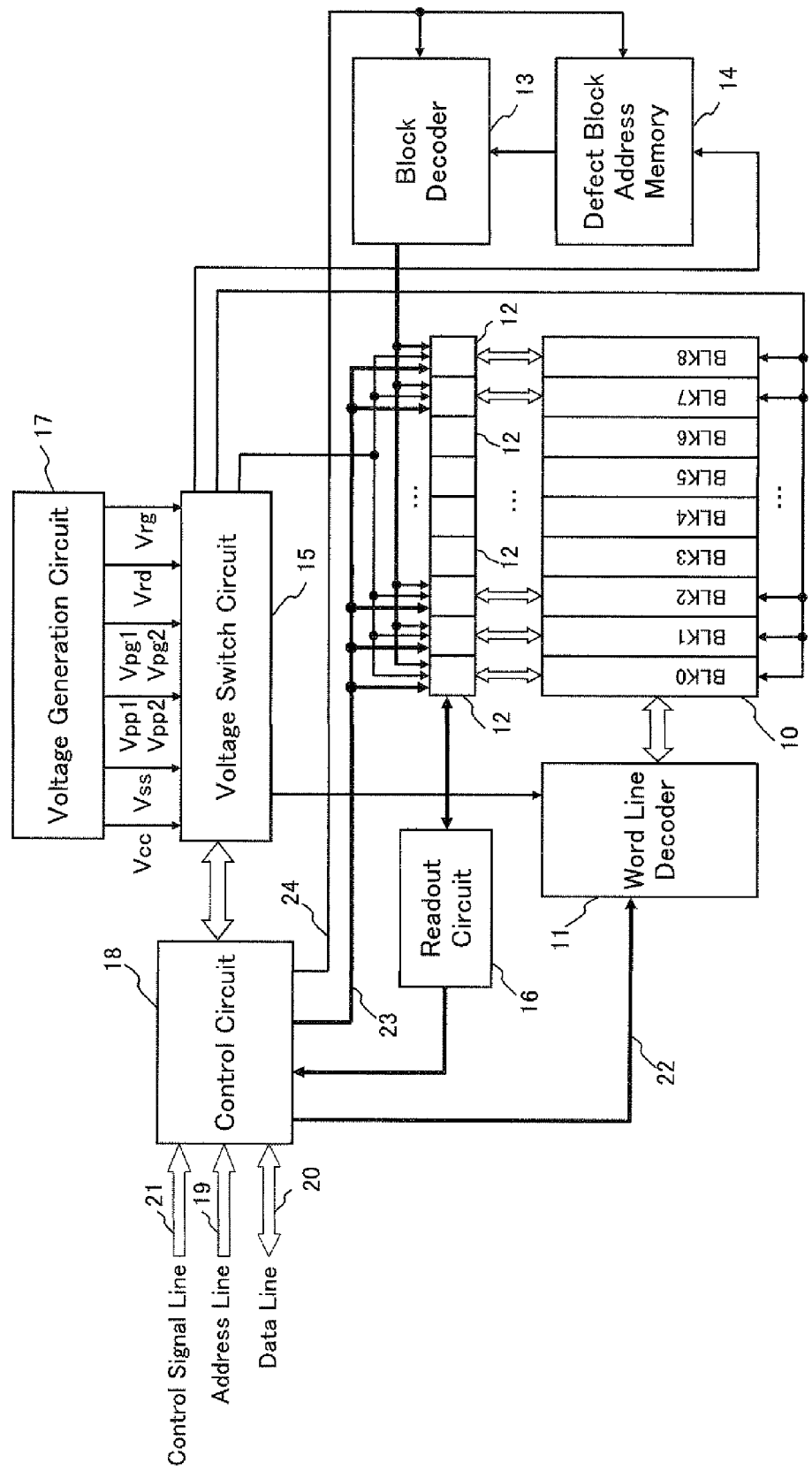
FIG. 8 is a block diagram schematically showing a configuration in one embodiment of the nonvolatile semiconductor memory device according to the present invention.

FIG. 8 shows a schematic configuration in one embodiment of the device of the present invention having a memory cell array configuration to accommodate the block redundancy relieving. As shown in FIG. 8, the device of the present invention includes a memory cell array 10, and around it, a word line decoder 11, a bit line decoder 12, a block decoder 13, a defect block address memory 14, a voltage switch circuit 15, a readout circuit 16, a voltage generation circuit 17, and a control circuit 18.

Figure 9:
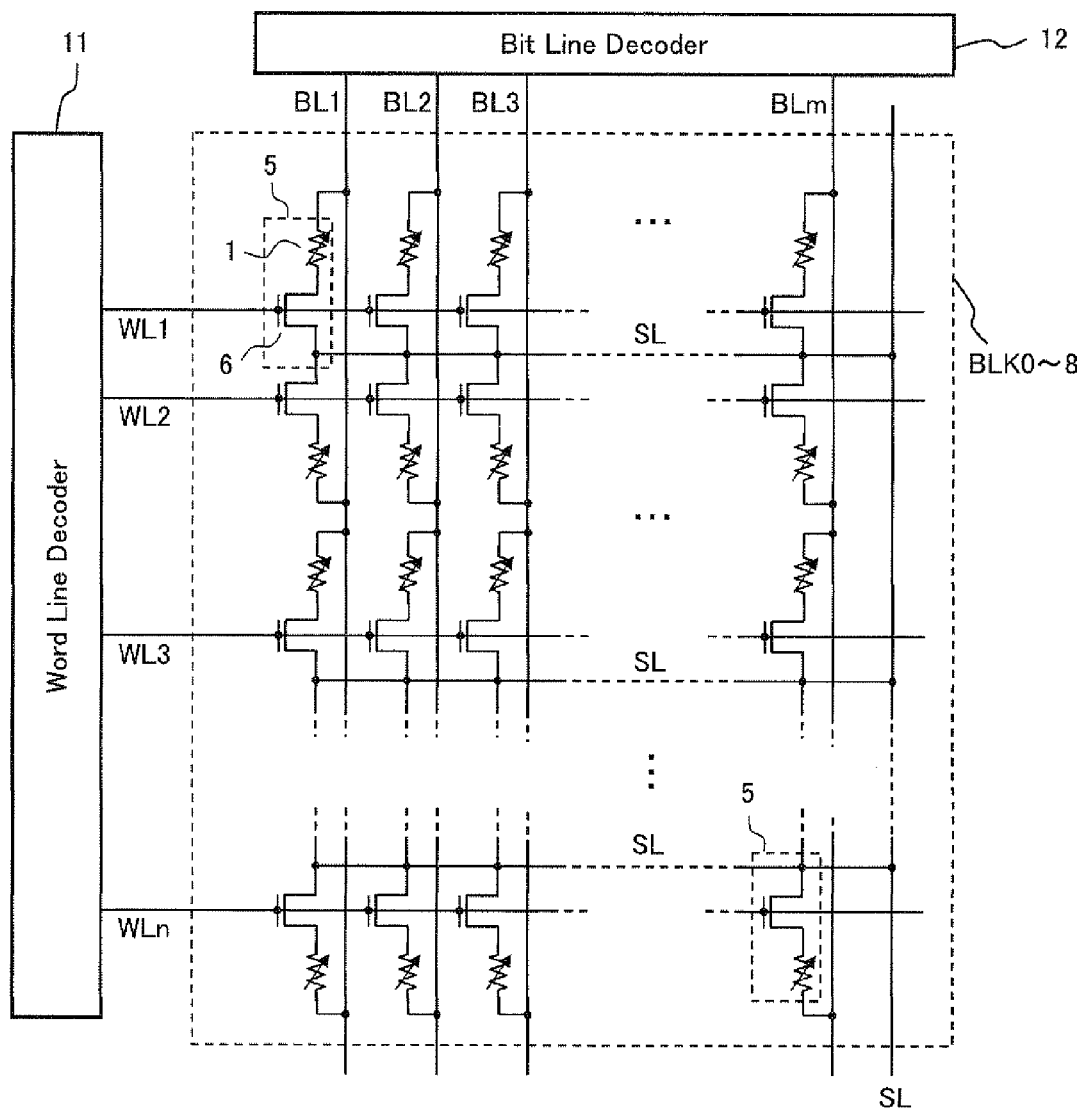
FIG. 9 is a circuit diagram schematically showing a configuration of one block of a memory cell array for storing user data used in one embodiment of the nonvolatile semiconductor memory device according to the present invention.

As shown in FIG. 8, the memory cell array 10 is divided into nine blocks in a row direction, and includes eight normal blocks BLK0 to 7 and one redundancy block BLK8. The blocks BLK0 to 8 have the same configuration, in which as shown in FIG. 9, m×n memory cells 5 shown in FIG. 2 are arranged at cross points of m bit lines BL1 to BLm extending in a column direction, and n word lines WL1 to WLn extending in the row direction. As shown in FIG. 9, in each of the blocks BLK0 to 8, each of the bit lines BL1 to BLm connects the first electrodes 2 of the variable resistive elements 1 of the memory cells 5 belonging to the same column and extends in the column direction, and each of the word lines WL1 to WLn connects the gates of the selection transistors 6 of the memory cells 5 belonging to the same row, and extends in the row direction. The sources of the selection transistors 6 of the memory cells 5 are connected to a common source line SL.

In addition, in FIG. 9, the source lines SL extend parallel to the word lines WL1 to WLn in the row direction, and are provided in each row, and connected to each other outside each of the blocks BLK0 to 8, so as to be driven by the block, but the source lines SL of all of the blocks BLK0 to 8 may be commonly driven, the one source line SL may be shared by the adjacent two rows, or may extend in the column direction instead of the row direction. Furthermore, the source lines SL may be provided in each of the blocks BLK0 to 8 so as to be selected to select the predetermined memory cell or memory cell group, similar to the word line and the bit line.

The word line decoder 11 decodes a row address signal 22 in an address signal inputted from an address line 19 to the control circuit 18, and applies predetermined gate voltages to the selected word line connected to the selected memory cells serving as an action target, and the unselected word line other than the above word line, to select the memory cells by the row in each of the blocks BLK0 to 8 in the reading action and the programming action.

The bit line decoder 12 is provided with respect to each of the blocks BLK0 to 8. The bit line decoder 12 corresponding to the selected block in the blocks BLK0 to 8 selected by the block decoder 13 decodes a column address signal 23 in the address signal inputted from the address line 19 to the control circuit 18, and applies a predetermined voltage to the selected bit line connected to the selected memory cell in the selected block to select the memory cells in the selected block by the column.

The block decoder 13 decodes a block address signal 24 in the address signal inputted from the address line 19 to the control circuit 18, and outputs a block selection signal to each of the blocks BLK0 to 8, for example, to select one of the blocks BLK0 to 8. The block decoder 13 compares the block address signal 24 with a defect block address outputted from the defect block address memory 14, and when they do not coincide with each other, it outputs the block selection signal to the selected block corresponding to the block address signal 24, in the blocks BLK0 to 7, and inactivates the normal blocks other than the selected block and the redundancy block BLK 8. Meanwhile, when they coincide with each other, the block decoder 13 forcibly inactivates the blocks BLK0 to 7 and activates the redundancy block BLK8. In addition, to detect the coincidence between the block address signal 24 and the defect block address, a logic circuit may be provided to perform the exclusive OR, or exclusive AND for corresponding bits, as one example. In addition, when a plurality of the redundancy blocks are provided, the defect block address memory 14 may be provided with respect to each redundancy block and the same process may be performed.

Figure 10:
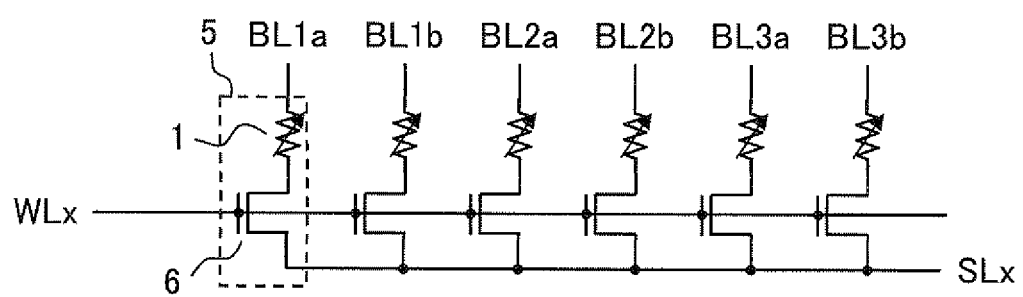
FIG. 10 is a circuit diagram schematically showing one example of an arrangement of the memory cells in a defect block address memory used in one embodiment of the nonvolatile semiconductor memory device according to the present invention.

The defect block address memory 14 stores a three-bit (when the number of the normal blocks is 8) defect block address using the memory cell 5 shown in FIG. 2. For example, as shown in FIG. 10, a pair of (two) memory cells 5 is used for one bit of the defect block address, and the resistance of one variable resistive element of the pair of memory cells is decreased, while the resistance of the other is increased. Here, for example, the six memory cells 5 are provided such that the sources of the selection transistors 6 are connected to a common source line SLx (provided separately from the source line SL of the memory cell array 10), the gates of the selection transistors 6 are connected to a common word line WLx (provided separately from the word lines WL1 to WLn of the memory cell array 10), the first electrodes of the variable resistive elements 1 are connected to respective bit lines BL1*a*, BL1*b*, BL2*a*, BL2*b*, BL3*a*, and BL3*b*, and the pairs of the bit lines BL1*a* and BL1*b*, the bit lines BL2*a* and BL2*b*, and the bit lines BL3*a* and BL3*b* correspond to the bits of the defect block address, respectively.

The programming action of the variable resistive element 1 constituting the defect block address memory 14 shown in FIG. 10 is performed at a test stage of the device of the present invention, that is, before shipment, in such a manner that a test mode is activated by a control signal inputted from a control signal line 21 and the like. In this case, the program condition of the resistance decreasing action is such that, as described above, at least one of the program current and the applying time of the voltage pulse is increased, as compared with the program condition of the resistance decreasing action of the memory cell array 10. The current value of the program current is adjusted by the gate voltage of the selection transistor 6 and a voltage value applied to both ends of the memory cell 5, and the applying time of the voltage pulse is adjusted by a time to apply the gate voltage of the selection transistor 6 and the voltage to both ends of the memory cell 5 at the same time. At the time of the resistance decreasing action for the memory cell 5 of the defect block address memory 14, when the program current is adjusted, it is preferably set to be 2 to 3 times as large as that provided at the time of the resistance decreasing action for the memory cell array 10. In addition, when the applying time of the voltage pulse is adjusted, it is preferably set to be 100 to 100000 times as long as that provided at the time of the resistance decreasing action of the memory cell array 10. The program condition may be previously set in the control circuit 18, or may be externally set. A circuit configuration for a programming action and a reading action of the variable resistive element of the defect block address memory 14 may include various kinds of circuit configurations, but detail of the circuit configuration is not a main object of the present invention, so that description thereof is omitted.

The control circuit 18 controls the programming action (the resistance increasing action and resistance decreasing action) and the reading action of each of the memory cell array 10 and the defect block address memory 14. The control circuit 18 controls the word line decoder 11, the bit line decoder 12, the voltage switch circuit 15, the readout circuit 16, and the voltage generation circuit 17, based on the address signal inputted from the address line 19, data input (at the time of programming action) inputted from a data line 20, and the control input signal inputted from the control signal line 21 to control the reading action and the programming action of the memory cell array 10. In addition, in the programming action and the reading action of the defect block address memory 14, the word line decoder 11, the bit line decoder 12, and the readout circuit 16 are not controlled. According to the example shown in FIG. 7, the control circuit 18 includes functions as an address buffer circuit, a data input/output buffer circuit, and a control input buffer circuit provided in general although they are not shown.

The voltage switch circuit 15 switches the voltage required for the reading action and the programming action of each of the memory cell array 10 and the defect block address memory 14, based on an action mode, and serves as a voltage supply circuit to supply the voltage to each of the memory cell array 10 and the defect block address memory 14. In the drawing, reference Vcc represents a power supply voltage of the device of the present invention, reference Vss represents a ground voltage, references Vpp1 and Vpp2 represent program voltages, references Vpg1 and Vpg2 represent the program gate voltages, reference Vrd represents a readout voltage, and reference Vrg represents a readout gate voltage. In addition, the power supply voltage Vcc and the ground voltage Vss are supplied from the external part of the device of the present invention to the voltage switch circuit 15, and the readout voltage Vrd, the readout gate voltage Vrg, the program voltages Vpp1 and Vpp2, and the program gate voltages Vpg1 and Vpg2 are generated in the device of the present invention, that is, generated from the power supply voltage Vcc or another power supply voltage by the voltage generation circuit 17, for example, but its detailed configuration is not the main object of the present invention, so that description thereof is omitted.

In addition, the program voltage Vpp is set at a lower limit value or more of a voltage range (absolute value) in which when the voltage is applied to both ends of the memory cell 5, the resistance of the variable resistive element 1 is actually increased and decreased in the resistance increasing action and the resistance decreasing action, and the readout voltage Vrd is sufficiently lower than an upper limit value of a voltage range (absolute value) in which when the voltage is applied to both ends of the memory cell 5, the resistance of the variable resistive element 1 is not increased and decreased in the resistance increasing action and the resistance decreasing action. Furthermore, the program gate voltage Vpg1 (for the resistance increasing action), the program gate voltage Vpg2 (for the resistance decreasing action), the readout gate voltage Vrg are set such that on-resistance of the selection transistor 6 in the selected memory cell becomes the resistance state suitable for the corresponding action at the time of each of the actions.

The readout circuit 16 converts the readout current flowing in the selected bit line selected by the bit line decoder 12 to voltage, determines the state of the stored data of the memory cell serving as the readout target connected to the selected bit line, transfers the result thereof to the control circuit 18 to be outputted to the data line 20.

Next, a brief description will be made of the programming action under the normal program condition for the memory cell array 10 for storing the user data.

At the time of the resistance increasing action, the ground voltage Vss (0 V) is applied to the selected bit line connected to the selected memory cell, the program gate voltage Vpg1 (such as 5 V) is applied to the selected word line connected to the selected memory cell, and the positive grogram voltage Vpp1 (such as 1.5 V) is applied to the source line SL connected to the selected memory cell, so that the selection transistor 6 of the selected memory cell is turned on and when a voltage drop between the drain and the source of the selection transistor 6 is close to 0 V, a voltage roughly equal to the positive program voltage Vpp1 is applied to the second electrode (on the side of the selection transistor) based on the first electrode (on the side of the selected bit line), whereby the resistance increasing action is performed.

At this time, when the ground voltage Vss (=0 V) is applied to the unselected word line not connected to the selected memory cell, the selection transistors 6 of the first and second unselected memory cells connected to the unselected word line are turned off and the voltage is not applied between the first and second electrodes of the variable resistive element 1 of the unselected memory cell. In addition, when the unselected bit line not connected to the selected memory cell is put into a floating state with no voltage applied thereto, the voltage is not applied between the first and second electrodes of the variable resistive element 1 of the third unselected memory cell connected to the unselected bit line and the selected word line. As a result, the resistance increasing action and the resistance decreasing action are not performed in any of the unselected memory cells.

At the time of the resistance decreasing action, the positive program voltage Vpp2 (such as 3 V) is applied to the selected bit line connected to the selected memory cell, the program gate voltage Vpg2 (such as 2 V) is applied to the selected word line connected to the selected memory cell, and the ground voltage Vss (0 V) is applied to the source line SL connected to the selected memory cell, so that the selection transistor 6 of the selected memory cell is turned on and when a voltage drop between the drain and the source of the selection transistor 6 is close to 0 V, a voltage roughly equal to the negative program voltage (−Vpp2) is applied to the second electrode (on the side of the selection transistor) based on the first electrode (on the side of the selected bit line), whereby the resistance decreasing action is performed. Here, with a view to reducing power consumption at the time of resistance decreasing action, and improving reliability such as the number of writing times, the program current Iw in a single memory cell is preferably less than 200 μA, and more preferably 100 μA or less.

At this time, when the ground voltage Vss (=0 V) is applied to the unselected word line not connected to the selected memory cell, the selection transistors 6 of the first and second unselected memory cells connected to the unselected word line are turned off and the voltage is not applied between the first and second electrodes of the variable resistive element 1 of the unselected memory cell. In addition, when the unselected bit line not connected to the selected memory cell is put into the floating state with no voltage applied thereto, the voltage is not applied between the first and second electrodes of the variable resistive element 1 of the third unselected memory cell connected to the unselected bit line and the selected word line. As a result, the resistance increasing action and the resistance decreasing action are not performed in any of the unselected memory cells.

Next, a description will be made of one example of the voltage applied to the memory cell array 10 at the time of the reading action. The readout voltage Vrd (such as 0.5 V) is applied to the selected bit line connected to the selected memory cell serving as the readout target, the readout gate voltage Vrg (such as 3 V) is applied to the selected word line connected to the selected memory cell, and the ground voltage Vss (0 V) is applied to the source line SL connected to the selected memory cell, so that the selection transistor 6 of the selected memory cell is turned on, and a readout current corresponding to the resistance state of the variable resistive element 1 in the selected memory cell flows from the selected bit line to the source line SL. This readout current is detected by the readout circuit 14 through the bit line decoder 12, whereby the reading action is performed.

At this time, when the ground voltage Vss (0 V) is applied to the unselected word line not connected to the selected memory cell, the selection transistors 6 of the first and second unselected memory cells connected to the unselected word line are turned off, and the voltage is not applied to the first and second electrodes of the variable resistive element 1 of the unselected memory cell. In addition, when the unselected bit line not connected to the selected memory cell is put into the floating state with no voltage applied thereto, the voltage is not applied to the first and second electrodes of the variable resistive element 1 of the third unselected memory cell connected to the unselected bit line and the selected word line. Thus, only the readout current flows in the selected bit line through the selected memory cell. In addition, the current does not flow in the unselected bit line, but since the unselected bit line is not selected by the bit line decoder 12, the state in which the current does not flow is not detected by the readout circuit 14 through the bit line decoder 12, so that only the readout current of the selected memory cell is correctly detected.

In addition, as for the memory cell array 10 for storing the user data, the resistance state of the variable resistive elements 1 of all of the memory cells 5 are initialized to the high resistance state by the above-described resistance increasing action in the unused state before shipment. Thus, even when the device of the present invention is exposed to a high temperature of about 260° C. in a solder reflow treatment by the user after shipment, the likelihood that the resistance state of the memory cell array 10 fluctuates is greatly reduced.

Next, a description will be made of the programming action of the three pairs of memory cells 5 constituting the defect block address memory 14 with reference to FIG. 10.

At the time of the resistance increasing action, the ground voltage Vss (0 V) is applied to the selected bit line connected to the one selected memory cell, in each of the three pairs of memory cells 5, the program gate voltage Vpg1 (such as 5 V) is applied to the word line WLx, and the positive grogram voltage Vpp1 (such as 1.5 V) is applied to the source line SLx, so that the selection transistor 6 of the selected memory cell is turned on and when a voltage drop between the drain and the source of the selection transistor 6 is close to 0 V, a voltage roughly equal to the positive program voltage Vpp1 is applied to the second electrode (on the side of the selection transistor) based on the first electrode (on the side of the selected bit line), whereby the resistance increasing action is performed. In this resistance increasing action, the voltage applying condition to each part is the same as that of the resistance increasing action for the memory cell array 10. In addition, the unselected bit line connected to the other unselected memory cell in each of the three pairs of the memory cells 5 is put into the floating state with no voltage applied thereto, or the program voltage Vpp1 is applied thereto, so that since the voltage is not applied between the first and second electrodes of the variable resistive element 1 of the unselected memory cell, the resistance increasing action is not performed.

At the time of the resistance decreasing action, the positive program voltage Vppx is applied to the selected bit line connected to the one selected memory cell in each of the three pairs of the memory cells 5, the program gate voltage Vpgx is applied to the word line WLx, and the ground voltage Vss (0 V) is applied to the source line SLx, so that the selection transistor 6 of the selected memory cell is turned on and the positive program voltage is applied to the second electrode (on the side of the selection transistor) based on the first electrode (on the side of the selected bit line) in each selected memory cell and the program current Iwx flows from the second electrode to the first electrode, whereby the resistance increasing action is performed. The program voltage Vppx and the gate voltage Vpgx, or the gate voltage Vpgx are set higher than the program voltage Vpp2 and the gate voltage Vpg2, or the gate voltage Vpg2 at the time of the resistance decreasing action of the memory cell array 10, respectively, so that the program current Iwx is adjusted so as to be 2 times to 3 times as large as that provided at the time of the resistance decreasing action of the memory cell array 10. More specifically, the program current Iwx is adjusted to 200 μA or more, preferably about 300 μA. Unlike the resistance decreasing action for the memory cell array 10, it is not necessary to give consideration to the increase in power consumption and reduction in the number of times of the writing actions. Here, instead of adjusting the voltage value of the program voltage Vppx and the gate Vpgx, or in addition to them, a time to apply the program voltage Vppx and the gate voltage Vpgx at the same time may be set to 100 times to 100000 times as long as that provided at the time of the resistance decreasing action of the memory cell array 10. More specifically, the voltage applying time is adjusted to 5 μs or more, preferably 50 μs to 5 ms. In addition, when the unselected bit line connected to the other unselected memory cell in each of the three pairs of the memory cells 5 is put into the floating state with no voltage applied thereto, or the ground voltage Vss is applied thereto, the voltage is not applied to the first and second electrodes of the variable resistive element 1 of the unselected memory cell, so that the resistance decreasing action is not performed.

Next, a description will be made of the reading action of the three pairs of memory cells 5 constituting the defect block address memory 14 with reference to FIG. 10. According to this reading action, all of the three pairs of memory cells 5 are the reading target. The readout voltage Vrd (such as 0.5 V) is applied to all of the bit lines BL1a, BL1b, BL2a, BL2b, BL3a, and BL3b, the readout gate voltage Vrg (such as 3 V) is applied to the word line WLx, and the ground voltage Vss (0 V) is applied to the source line SLSx, so that the selection transistor 6 of each memory cell 5 is turned on, and a readout current corresponding to the resistance state of the variable resistive element 1 in each memory cell 5 flows from the respective bit lines BL1a, BL1b, BL2a, BL2b, BL3a, and BL3b to the source line SL. The resistance states of the variable resistive elements 1 of the pairs of memory cells 5 connected to the pairs of bit lines BLia, and BLib (i=1 to 3) are such that one is the high resistance state and the other is the low resistance state, so that since there is a difference in the readout current, each bit of the defect block address can be determined by detecting which readout current is large. The read defect block address is stored in a register once, so that it is not necessary to read the defect block address each time of the reading action of the memory cell array 10.

Next, a description will be made of other embodiments of the device of the present invention.

(1) The description has been made of the case where the n-type metal oxide is used for the variable resistor 4 of the variable resistive element 1 in the above embodiment, and in a case where the p-type metal oxide is used, similarly to the case where the n-type metal oxide is used, there is a possibility that the resistance of the variable resistive element in the low resistance state is increased after being left at the high temperature because it is considered that the resistance switching is caused by the generation and extinction of the oxygen defect or the movement of the oxygen defect by the electric field in the filament path in the metal oxide formed by the forming process. When the variable resistor 4 is the p-type metal oxide, one of the first electrode and the second electrode needs to be formed of a conductive material having a large work function so that the ohmic junction is formed in the interface with the variable resistor 4, and the other needs to be formed of a conductive material having a small work function so that the non-ohmic junction (Schottky junction) is formed in the interface with the variable resistor 4. While a specific value of the working function is determined by the relationship with the electron trapping level generated due to the generation of the oxygen defect in the oxide of the variable resistor 4, the work function of the electrode on the side of the non-ohmic junction is preferably 4.5 eV or less when the p-type metal oxide is used. The P-type metal oxide which can be used for the variable resistor 4 includes a metal oxide selected from Cu, Co, or Ni.

(2) While the memory cell 5 has the three-terminal configuration in which the second electrode 3 of the variable resistive element 1 is connected to the drain of the selection transistor 6, the first electrode 2 of the variable resistive element 1 is connected to the bit line BL, and the source of the selection transistor 6 is connected to the source line SL, in the above embodiment, the configuration of the memory cell 5 is not limited to the configuration shown in FIG. 2. For example, other three-terminal configurations include a configuration in which the first electrode 2 of the variable resistive element 1 is connected to the drain of the selection transistor 6, the second electrode 3 of the variable resistive element 1 is connected to the bit line BL, and the source of the selection transistor 6 is connected to the source line SL, a configuration in which the second electrode 3 of the variable resistive element 1 is connected to the source of the selection transistor 6, the first electrode 2 of the variable resistive element 1 is connected to the source line SL, and the drain of the selection transistor 6 is connected to the bit line BL, or a configuration in which the first electrode 2 of the variable resistive element 1 is connected to the source of the selection transistor 6, the second electrode 3 of the variable resistive element 1 is connected to the source line SL, and the drain of the selection transistor 6 is connected to the bit line BL. However, the voltage value and polarity of the voltage applied to each part is to be appropriately changed based on each configuration.

Figure 11:
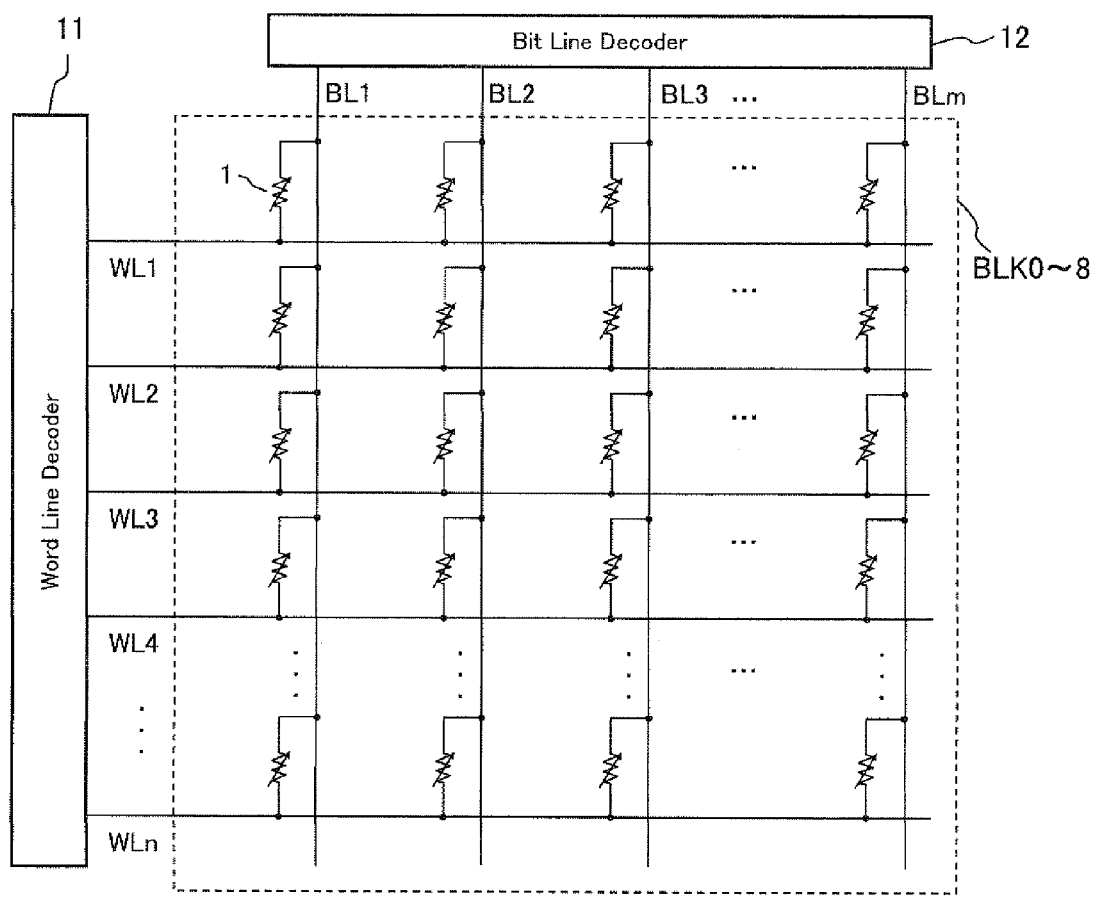
FIG. 11 is a circuit diagram schematically showing a configuration of a memory cell array used in another embodiment of the nonvolatile semiconductor memory device according to the present invention.

Furthermore, the memory cell 5 may have a two-terminal configuration. For example, when the two-terminal type memory cell is only made up of the variable resistive element 1, each block memory cell array 10 of the memory cell array 10 has a configuration shown in FIG. 11. In addition, the two-terminal type memory cell may be configured such that the variable resistive element 1 is connected to a two-terminal type bidirectional current limit element (such as a varistor) in series.

(3) The structure in which the variable resistor 4 is sandwiched between the first and second electrodes 2 and 3 is shown in the above embodiment as the structure of the variable resistive element 1, and when the above material is used for the variable resistor 4, it is necessary to perform the forming process after the variable resistive element 1 has been formed such that the voltage pulse is applied for a relatively long time compared with that at the time of programming action to decrease the resistance state (initial resistance state) of the variable resistive element 1 to the resistance state in which the switching action can be performed. When the current is prevented from flowing in the variable resistive element in the forming process, the resistance state after the forming process can be prevented from varying, so that a buffer layer may be provided between the variable resistor 4 and one of the first and second electrodes 2 and 3 (preferably on the side of the non-ohmic junction) to prevent the current from flowing at the time of the forming process. In addition, the buffer layer may be provided not for preventing the variation but for adjusting a program blocking voltage at the time of the programming action.

(4) While the description has been made assuming the defect block address in the memory cell array configuration to accommodate the block redundancy relieving as the specific data, the specific data is not limited to the defect block address. For example, when the redundancy relieving is provided by the row or the column instead of by the block or in addition thereto, program information of a switch circuit to switch a defect row or a defect column to a redundancy row or a redundancy column is preferably stored in the specific memory region as the specific data. In addition, even when the defect block address is stored as the specific data, the memory cell array does not necessarily correspond to the block redundancy relieving. That is, the present invention can be applied to an embodiment in which the defect block is simply avoided and only a normal block having no defect memory cell is used.

In addition, as the specific data, data related to a product such as the production number is preferably stored in a dedicated specific memory region regardless of whether or not the redundancy relieving is provided. Since the specific memory region assumes that the data is read out to the outside in a specific readout mode, the specific memory region is preferably incorporated in a readout system of the user data.

Furthermore, the specific data may be data which is not supposed to be individually read. For example, when a reference memory cell to be used at the time of reading action for the selected memory cell of the memory cell array 10 is configured by combining a memory cell fixed to the high resistance state and a memory cell fixed to the low resistance state, a resistance state fixed to the memory cell constituting the reference memory cell is preferably handled as the specific data. That is, the resistance decreasing action for the memory cell fixed to the low resistance state is preferably performed similarly to the resistance decreasing action in the above defect block address memory 14.

In addition, in a case of a circuit configuration in which algorithm for controlling the memory action such as the programming action of the device of the present invention is stored in the device, that is, in a case where the programming action is controlled by a built-in state machine or microprocessor, a code for describing the state machine or an execution program (microcode) of the microprocessor may be stored as the specific data.

(5) While the description has been made of the case where the voltages are applied to the bit line, the word line, and the source line in the programming action and the reading action in the above embodiment, the values of the voltages are just one example, and may be appropriately changed according to the characteristics of the variable resistive element to be used. In addition, while the different program voltages Vpp1 and Vpp2 are used in the resistance increasing action and the resistance decreasing action, respectively in the above embodiment, the voltage may be the same, depending on the program characteristics of the variable resistive element to be used. In addition, the on-resistance of the selection transistor 6 is set to become the resistance state suitable for the corresponding action, but when the voltage drop between the drain and the source of the selection transistor 6 cannot be ignored compared to the voltage drop of the variable resistive element 1, at the time of the programming action, a voltage to compensate the voltage drop of the selection transistor 6 may be applied between the bit line and source line. Furthermore, while the description has been made of the case where the ground voltage Vss is applied to the selected bit line and the positive program voltage Vpp1 is applied to the source line SL at the time of the resistance increasing action, the ground voltage Vss may be applied to the source line SL, and the negative program voltage (−Vpp1) may be applied to the selected bit line. However, it is to be noted that the negative gate voltage (−Vpp1) needs to be applied to the unselected word line to completely turn off the selection transistor of the unselected memory cell connected to the selected bit line.

(6) While the description has been made of the case of the bipolar switching to reverse the polarity of the program voltage applied between the first electrode 2 and the second electrode 3 of the variable resistive element 1 at the time of the resistance increasing action and the resistance decreasing action in the programming action in the above embodiment, the polarity of the program voltage applied between the first electrode 2 and the second electrode 3 may be the same polarity by changing the characteristics of the load circuit connected to the variable resistive element, depending on the characteristics of the variable resistive element to be used at the time of the resistance increasing action and the resistance decreasing action.

(7) It is assumed that two-valued data is stored in each memory cell of the memory cell array 10 for storing the user data in the above embodiment, but when the three-valued or more data is stored, similarly to the above embodiment, it is preferable that the resistance state of the variable resistive elements of all of the memory cells in the memory cell array is increased to the highest level in an unused state before the user programs the data in the memory cell array.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A nonvolatile semiconductor memory device comprising
   a memory cell array for storing user data, provided by arranging a plurality of memory cells each provided with a variable resistive element including a first electrode, a second electrode, and a variable resistor made up of a metal oxide and sandwiched between the first electrode and the second electrode, wherein
   the metal oxide is an insulator in an initial state,
   resistance of the variable resistive element is decreased by a forming process,
   a resistance state of the variable resistive element changes between two or more different resistance states by application of a voltage between the first electrode and the second electrode after the forming process,
   the resistance state after being changed is maintained in a nonvolatile manner, and
   the variable resistive elements of all of the memory cells in the memory cell array are set to the highest resistance state of the two or more different resistance states in an unused state before the memory cell array is used to store the user data.

2. The nonvolatile semiconductor memory device according to claim 1, further comprising:
   a specific memory region for storing specific data other than the user data using the one or more variable resistive elements, provided separately from the memory cell array; and
   a program circuit to execute a resistance increasing action to change the resistance state of the variable resistive element from a low resistance state to a high resistance state, and a resistance decreasing action to change the resistance state thereof from the high resistance state to the low resistance state, by applying a program voltage between the first electrode and the second electrode to pass a program current through the variable resistive element in the memory cell array, wherein
   in the unused state, the resistance of at least one part of the variable resistive elements of the specific memory region is decreased by the resistance decreasing action under an enhanced application condition that at least one of a voltage applying time and a current value of the program current is increased, as compared with a condition of the program voltage applied when the program circuit executes the resistance decreasing action for the variable resistive element in the memory cell array.

3. The nonvolatile semiconductor memory device according to claim 1, further comprising:

a specific memory region for storing specific data other than the user data using the one or more variable resistive elements, provided separately from the memory cell array; and a program circuit to execute a resistance increasing action to change the resistance state of the variable resistive element from a low resistance state to a high resistance state, and a resistance decreasing action to change the resistance state thereof from the high resistance state to the low resistance state, by applying a program voltage between the first electrode and the second electrode to pass a program current through the variable resistive element in the memory cell array, wherein the program circuit executes the resistance decreasing action when the program circuit programs the user data in the variable resistive element in the memory cell array, under a condition that at least one of a voltage applying time and a current value of the program current is decreased, as compared with a condition of the program voltage applied when the resistance decreasing action is performed for at least one part of the variable resistive elements of the specific memory region in the unused state.

4. The nonvolatile semiconductor memory device according to claim 2, wherein the program circuit executes the resistance decreasing action when the program circuit programs the user data in the variable resistive element in the memory cell array, under a condition that at least one of a voltage applying time and a current value of the program current is decreased, as compared with a condition of the program voltage applied when the resistance decreasing action is performed for at least one part of the variable resistive elements of the specific memory region in the unused state.

5. A nonvolatile semiconductor memory device comprising:

a memory cell array for storing user data, provided by arranging a plurality of memory cells each provided with a variable resistive element including a first electrode, a second electrode, and a variable resistor made up of a metal oxide and sandwiched between the first electrode and the second electrode, the metal oxide being an insulator in an initial state, resistance of the variable resistive element being decreased by a forming process, a resistance state of the variable resistive element changing between two or more different resistance states by application of a voltage between the first electrode and the second electrode after the forming process, the resistance state after being changed being maintained in a nonvolatile manner;

a specific memory region for storing specific data other than the user data using the one or more variable resistive elements; and a program circuit to execute a resistance increasing action to change the resistance state of the variable resistive element from a low resistance state to a high resistance state, and a resistance decreasing action to change the resistance state thereof from the high resistance state to the low resistance state, by applying a program voltage between the first electrode and the second electrode to pass a program current through the variable resistive element in the memory cell array, wherein in an unused state before the memory cell array is used to store the user data, the resistance of at least one part of the variable resistive elements of the specific memory region is decreased by the resistance decreasing action under an enhanced application condition that at least one of a voltage applying time and a current value of the program current is increased, as compared with a condition of the program voltage applied when the program circuit executes the resistance decreasing action for the variable resistive element in the memory cell array.

6. The nonvolatile semiconductor memory device according to claim 5, wherein the program circuit executes the resistance decreasing action when the program circuit programs the user data in the variable resistive element in the memory cell array, under a condition that at least one of a voltage applying time and a current value of the program current is decreased, as compared with a condition of the program voltage applied when the resistance decreasing action is performed for at least one part of the variable resistive elements of the specific memory region in the unused state.

7. A nonvolatile semiconductor memory device comprising:

a memory cell array for storing user data, provided by arranging a plurality of memory cells each provided with a variable resistive element including a first electrode, a second electrode, and a variable resistor made up of a metal oxide and sandwiched between the first electrode and the second electrode, the metal oxide being an insulator in an initial state, resistance of the variable resistive element being decreased by a forming process, a resistance state of the variable resistive element changing between two or more different resistance states by application of a voltage between the first electrode and the second electrode after the forming process, the resistance state after being changed being maintained in a nonvolatile manner;

a specific memory region for storing specific data other than the user data using the one or more variable resistive elements; and a program circuit to execute a resistance increasing action to change the resistance state of the variable resistive element from a low resistance state to a high resistance state, and a resistance decreasing action to change the resistance state thereof from the high resistance state to the low resistance state, by applying a program voltage between the first electrode and the second electrode to pass a program current through the variable resistive element in the memory cell array, wherein the program circuit executes the resistance decreasing action when the program circuit programs the user data in the variable resistive element in the memory cell array, under a condition that at least one of a voltage applying time and a current value of the program current is decreased, as compared with a condition of the program voltage applied when the resistance decreasing action is performed for at least one part of the variable resistive elements of the specific memory region in the unused state.

8. The nonvolatile semiconductor memory device according to claim 1, wherein the variable resistor is formed of a metal oxide showing an n-type conductivity, and a work function of the second electrode is larger than a work function of the first electrode.

9. The nonvolatile semiconductor memory device according to claim 5, wherein the variable resistor is formed of a metal oxide showing an n-type conductivity, and a work function of the second electrode is larger than a work function of the first electrode.

10. The nonvolatile semiconductor memory device according to claim 7, wherein
the variable resistor is formed of a metal oxide showing an n-type conductivity, and a work function of the second electrode is larger than a work function of the first electrode.

11. The nonvolatile semiconductor memory device according to claim 8, wherein
the variable resistor contains an oxide of a metal selected from Ti, Ta, Hf, and Zr.

12. The nonvolatile semiconductor memory device according to claim 9, wherein
the variable resistor contains an oxide of a metal selected from Ti, Ta, Hf, and Zr.

13. The nonvolatile semiconductor memory device according to claim 10, wherein
the variable resistor contains an oxide of a metal selected from Ti, Ta, Hf, and Zr.

14. A programming method in a nonvolatile semiconductor memory device, the device comprising a memory cell array for storing user data, provided by arranging a plurality of memory cells each provided with a variable resistive element including a first electrode, a second electrode, and a variable resistor made up of a metal oxide and sandwiched between the first electrode and the second electrode, the metal oxide being an insulator in an initial state, resistance of the variable resistive element being decreased by a forming process, a resistance state of the variable resistive element changing between two or more different resistance states by application of a voltage between the first electrode and the second electrode after the forming process, the resistance state after being changed being maintained in a nonvolatile manner, the method comprising
setting the variable resistive elements of all of the memory cells in the memory cell array to the highest resistance state of the two or more different resistance states in an unused state before the memory cell array is used to store the user data.

15. The programming method according to claim 14, the nonvolatile semiconductor memory device further comprising:
a specific memory region for storing specific data other than the user data using the one or more variable resistive elements, provided separately from the memory cell array; and
a program circuit to execute a resistance increasing action to change the resistance state of the variable resistive element from a low resistance state to a high resistance state, and a resistance decreasing action to change the resistance state thereof from the high resistance state to the low resistance state, by applying a program voltage between the first electrode and the second electrode to pass a program current through the variable resistive element in the memory cell array, the method further comprising
decreasing the resistance of at least one part of the variable resistive elements of the specific memory region in the unused state by the resistance decreasing action under an enhanced application condition that at least one of a voltage applying time and a current value of the program current is increased, as compared with a condition of the program voltage applied when the program circuit executes the resistance decreasing action for the variable resistive element in the memory cell array.

16. The programming method according to claim 14, the nonvolatile semiconductor memory device further comprising:
a specific memory region for storing specific data other than the user data using the one or more variable resistive elements, provided separately from the memory cell array; and
a program circuit to execute a resistance increasing action to change the resistance state of the variable resistive element from a low resistance state to a high resistance state, and a resistance decreasing action to change the resistance state thereof from the high resistance state to the low resistance state, by applying a program voltage between the first electrode and the second electrode to pass a program current through the variable resistive element in the memory cell array, the method further comprising
executing the resistance decreasing action using the program circuit when the user data is programmed in the variable resistive element in the memory cell array, under a condition that at least one of a voltage applying time and a current value of the program current is decreased, as compared with a condition of the program voltage applied when the resistance decreasing action is performed for at least one part of the variable resistive elements of the specific memory region in the unused state.

17. A programming method in a nonvolatile semiconductor memory device, the device comprising:
a memory cell array for storing user data, provided by arranging a plurality of memory cells each provided with a variable resistive element including a first electrode, a second electrode, and a variable resistor made up of a metal oxide and sandwiched between the first electrode and the second electrode, the metal oxide being an insulator in an initial state, resistance of the variable resistive element being decreased by a forming process, a resistance state of the variable resistive element changing between two or more different resistance states by application of a voltage between the first electrode and the second electrode after the forming process, the resistance state after being changed being maintained in a nonvolatile manner;
a specific memory region for storing specific data other than the user data using the one or more variable resistive elements; and
a program circuit to execute a resistance increasing action to change the resistance state of the variable resistive element from a low resistance state to a high resistance state, and a resistance decreasing action to change the resistance state thereof from the high resistance state to the low resistance state, by applying a program voltage between the first electrode and the second electrode to pass a program current through the variable resistive element in the memory cell array, the method comprising
decreasing the resistance of at least one part of the variable resistive elements of the specific memory region in an unused state before the memory cell array is used to store the user data, by the resistance decreasing action under an enhanced application condition that at least one of a voltage applying time and a current value of the program current is increased, as compared with a condition of the program voltage applied when the program circuit executes the resistance decreasing action for the variable resistive element in the memory cell array.

18. The programming method according to claim 17, further comprising executing the resistance decreasing action using the program circuit when the user data is programmed in the variable resistive element in the memory cell array, under a condition that at least one of a voltage applying time and a current value of the program current is decreased, as compared with a condition of the program voltage applied when the resistance decreasing action is performed for at least one part of the variable resistive elements of the specific memory region in the unused state.

19. A programming method of a nonvolatile semiconductor memory device, the device comprising:

a memory cell array for storing user data, provided by arranging a plurality of memory cells each provided with a variable resistive element including a first electrode, a second electrode, and a variable resistor made up of a metal oxide and sandwiched between the first electrode and the second electrode, the metal oxide being an insulator in an initial state, resistance of the variable resistive element being decreased by a forming process, a resistance state of the variable resistive element changing between two or more different resistance states by application of a voltage between the first electrode and the second electrode after the forming process, the resistance state after being changed being maintained in a nonvolatile manner;

a specific memory region for storing specific data other than the user data using the one or more variable resistive elements; and a program circuit to execute a resistance increasing action to change the resistance state of the variable resistive element from a low resistance state to a high resistance state, and a resistance decreasing action to change the resistance state thereof from the high resistance state to the low resistance state, by applying a program voltage between the first electrode and the second electrode to pass a program current through the variable resistive element in the memory cell array, the method comprising executing the resistance decreasing action using the program circuit when the user data is programmed in the variable resistive element in the memory cell array, under a condition that at least one of a voltage applying time and a current value of the program current is decreased, as compared with a condition of the program voltage applied when the resistance decreasing action is performed for at least one part of the variable resistive elements of the specific memory region in the unused state.

* * * * *